United States Patent
Lubomirsky

(10) Patent No.: US 6,592,709 B1
(45) Date of Patent: Jul. 15, 2003

(54) METHOD AND APPARATUS FOR PLASMA PROCESSING

(75) Inventor: Dmitry Lubomirsky, Cupertino, CA (US)

(73) Assignee: Applied Materials Inc., Santa Clara, CA (US)

( * ) Notice: Subject to any disclaimer, the term of this patent is extended or adjusted under 35 U.S.C. 154(b) by 0 days.

(21) Appl. No.: 09/545,744

(22) Filed: Apr. 5, 2000

(51) Int. Cl.[7] .......................... H05H 1/00; C23C 16/00; H01J 21/00
(52) U.S. Cl. ........................... 156/345.48; 156/345.33; 118/723 I; 315/111.51
(58) Field of Search ................ 156/345.48, 345.43, 156/345.33; 315/111.51; 118/723 I, 715, 733, 723 AN

(56) References Cited

U.S. PATENT DOCUMENTS

| | | | |
|---|---|---|---|
| 5,061,838 A | 10/1991 | Lane et al. | 219/121.59 |
| 5,558,717 A | * 9/1996 | Zhao et al. | 118/715 |
| 5,683,561 A | * 11/1997 | Hollars et al. | 204/298.25 |
| 5,792,272 A | * 8/1998 | Os et al. | 118/713 IR |
| 5,865,896 A | * 2/1999 | Nowak et al. | 118/723 I |
| 5,871,813 A | * 2/1999 | Pham | 427/248.1 |

FOREIGN PATENT DOCUMENTS

| | | | |
|---|---|---|---|
| EP | 0 903 769 | 3/1999 | H01J/37/32 |
| WO | WO 98/01012 | 1/1998 | H05H/1/00 |
| WO | WO 00/00741 | 1/2000 | F04B/37/14 |
| WO | WO 01/78101 A2 | * 10/2001 | H01J/37/00 |

OTHER PUBLICATIONS

US patent application Publication No. US–2001/0016166–A1, Dandle et al, Appl. No. 09/749,469, Filed Dec. 28, 2000.*
PCT International Search Report from PCT/US 01/11234, Dated Oct. 23, 2001.

* cited by examiner

Primary Examiner—Parviz Hassanzadeh
(74) Attorney, Agent, or Firm—Moser, Patterson, Sheridan; Joseph Bach

(57) ABSTRACT

The present invention provides a method and apparatus for processing substrates. A processing system includes a chamber having a top mounted pumping assembly. The chamber comprises a ceiling disposed on a chamber body and having an opening formed therein. The pumping assembly is connected to the ceiling and registered with the opening. The pumping assembly operates to evacuate the chamber to a desired pressure. One or more gases are supplied to the chamber via a gas distribution chamber and are exhausted from the chamber via the opening formed in the ceiling.

10 Claims, 6 Drawing Sheets

METHOD AND APPARATUS FOR PLASMA PROCESSING

BACKGROUND OF THE INVENTION

1. Field of the Invention

The present invention relates to a method and apparatus for processing substrates. Specifically, the invention relates to processing systems.

2. Background of the Related Art

Semiconductor processing typically involves the deposition and/or removal (etching) of materials from a substrate. Frequently, semiconductor processes require a vacuum environment. As a result, processing systems generally include a vacuum chamber coupled to a pumping system. The pumping system includes a vacuum pump which, when in communication with the chamber, can reduce the pressure of the enclosure defined by the vacuum chamber.

FIG. 1 is a schematic drawing of a typical processing system 100. The processing system 100 generally includes a chamber 102 having a dome-shaped top 103, a pumping module 104 and a gas delivery module 112. An opening 106 formed in the chamber body allows fluid communication between the chamber 102 and the pumping module 104. A support member 108 is disposed in the chamber 102 and provides a substrate receiving surface 110 adapted to support a substrate 111 during processing. The gas delivery module 112 is coupled to the chamber 102 via supply lines 113 and provides one or more gases to the chamber 102 during processing. A plasma generating assembly comprising a coil 115 disposed on the top 103 and a power supply 117 connected to the coil 115 is provided to generate a plasma in the chamber 102. Although not shown, the processing system 100 may include additional components known in the art such as sensors, motors, etc.

The processing system 100 is adaptable to plasma processing including etching and chemical vapor deposition (CVD). In the case of etching, etching gases are introduced into the chamber 102 and a plasma is struck by flowing a current through the coil 115. The reactive species in the plasma then etch the exposed portion of the metal, dielectric, or semiconductive material on the substrate 111. In order to maintain a desired pressure in the chamber 102, as well as remove gaseous by-products, the chamber 102 and the pumping module 104 are communicated via the opening 106. The resulting flow pattern of gases in the chamber 102 is shown by arrows 120.

One problem with conventional chambers is the non-symmetric flow of gases over the substrate being processed. Flow symmetry is important in order to ensure uniform deposition or removal of material from the substrate. The arrows 120 in FIG. 1 illustrate the non-uniform flow pattern within the chamber 102. In the case of an etching chamber for example, such a flow pattern results in a non-uniform etch rate of material from the substrate.

Another problem with conventional chambers, including etch chambers, is the potential for contamination of substrates being processed. During processing, material etched from the substrate or deposition gases introduced in the chamber deposit on the chamber surfaces and form a film thereon. Over time, such films may crack or chip under the influence of thermal stresses and gravitational forces. Portions of the film may then flake and deposit on the substrate resulting in defective devices. Issues of substrate contamination are typically addressed by periodically cleaning the chamber. For example, one or more cleaning gases may be flowed into the chamber to remove deposition from the chamber surfaces. The cleaning gases react with the deposited material to form gaseous by-products that can then be removed from the chamber by a pumping mechanism. The frequency at which a chamber is cleaned is typically referred to as the mean-wafer-between-clean (MWBC). Depending on the particular process being run in the chamber, the MWBC may be less than about one thousand wafers resulting in a significant detrimental impact on the overall throughput of the system.

One solution to the problem of contamination is to control the temperature of the chamber. Temperature control mitigates the thermal stresses that can lead to flaking and contamination. Accordingly, some processing systems, such as the one shown in FIG. 1, include a temperature control unit 124. The temperature control unit 124 in FIG. 1 is disposed around the dome 103 because deposition is typically increased on the inner surface of the dome 103. However, even where cooling units are used, particles are still generated in the chamber. Thus, conventional chambers continue to experience significant contamination of substrates. Further, temperature control units are expensive, both in the purchase price and the cost of operation. Additionally, the temperature control units typically occupy a large volume, thereby greatly increasing the amount of space needed for the processing system.

Another problem with conventional chambers is their lack of serviceability. For example, chambers are often coated with a material to prevent corrosion of chamber surfaces. The coating apparatus is typically an automated device with a pressurized fluid source and a spray nozzle. The coating apparatus is robotically actuated vertically along a central axis while simultaneously being rotated about the axis. However, due to their complex design, the chambers are not easily accessible to an automated coating apparatus. As a result, the surfaces are unevenly coated or, in some cases, not coated at all. For example, the chamber 102 typically consists of a manifold or plenum having an exhaust channel (e.g., the opening 106) formed therein. The exhaust channel extends outwardly from the body of the chamber 102 and is coupled at its end to the pumping module 104. Such an arrangement, wherein the surfaces lie along different planes and at different radii from a central axis, makes coating all surfaces of the chamber 102 with an automated device difficult.

Therefore, there is a need for a process chamber providing uniform flow of gases over a substrate while preferably mitigating the potential for contamination of the chamber and affording serviceability.

SUMMARY OF THE INVENTION

The present invention generally provides a method and apparatus for processing substrates. In one aspect of the invention, a processing system comprises a chamber having a top mounted pumping assembly. The chamber comprises a ceiling disposed on a chamber body and having an opening formed therein. The pumping assembly is connected to the ceiling and registered with the opening.

In another aspect of the invention, a chamber comprises a floor, a sidewall and an opening formed at an upper end of the chamber and a pumping assembly connected to the chamber and registered with the opening.

The chamber may further comprise a gas manifold disposed at an upper end of the chamber and defining an opening, an energy transmissive member disposed on the gas manifold, and a pumping assembly coupled to an upper end of the energy transmissive member.

In yet another aspect of the invention, an apparatus comprises a chamber body comprising a floor and a sidewall and defining an enclosure; a substrate support member disposed in the chamber body; a gas manifold disposed at an upper end of the chamber body; a fluid supply unit coupled to the gas manifold; an energy transmissive member disposed on the gas manifold and defining an opening at an upper end; a plasma generating assembly disposed about the energy transmissive member; and a pumping assembly coupled to the upper end of the energy transmissive member.

In still another aspect of the invention, a method for processing a substrate, comprises providing a chamber defining a processing region and having an opening formed at an upper end thereof; and evacuating the processing region through the opening.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1:
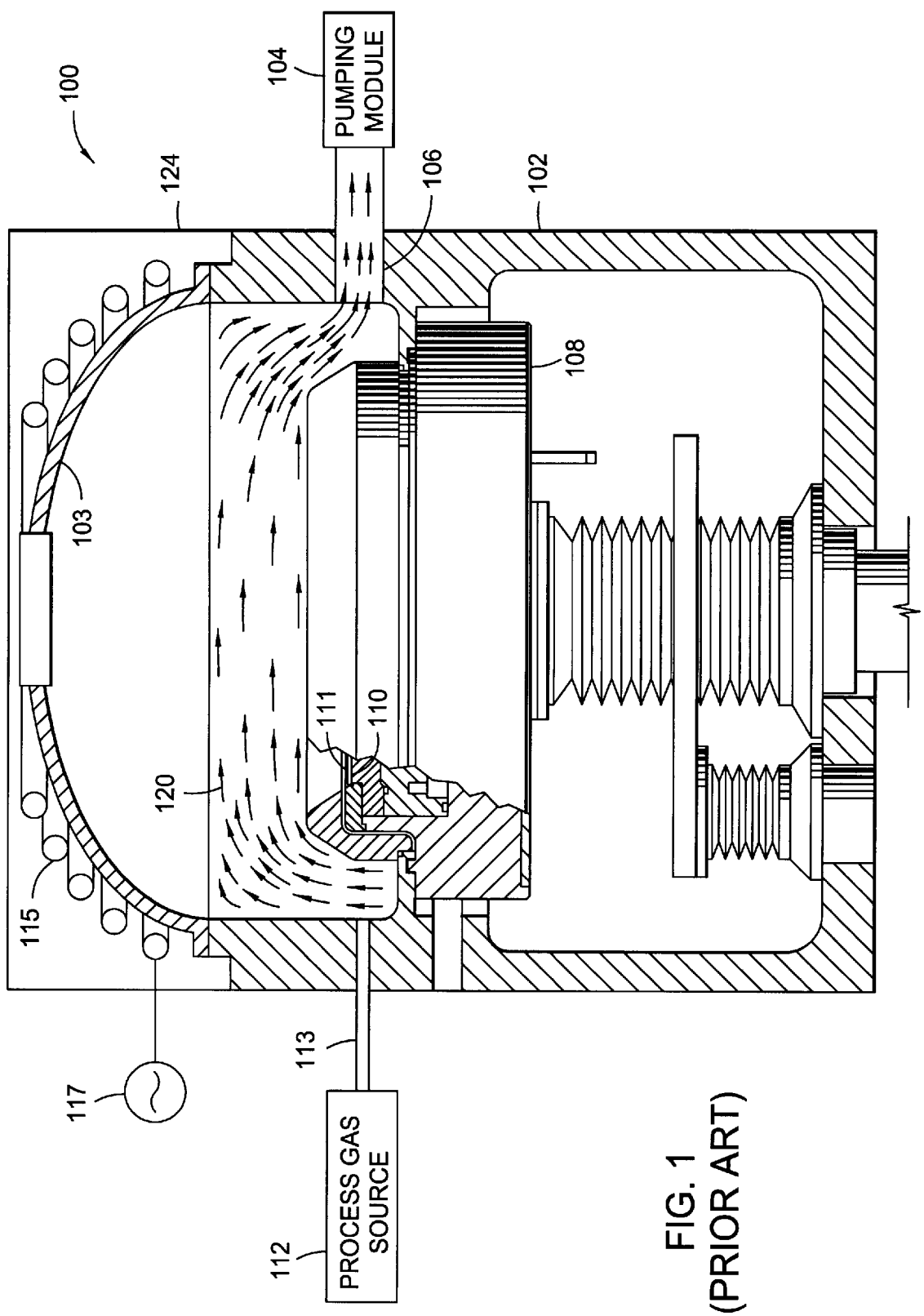
FIG. 1 is a prior art processing system.
Figure 2:
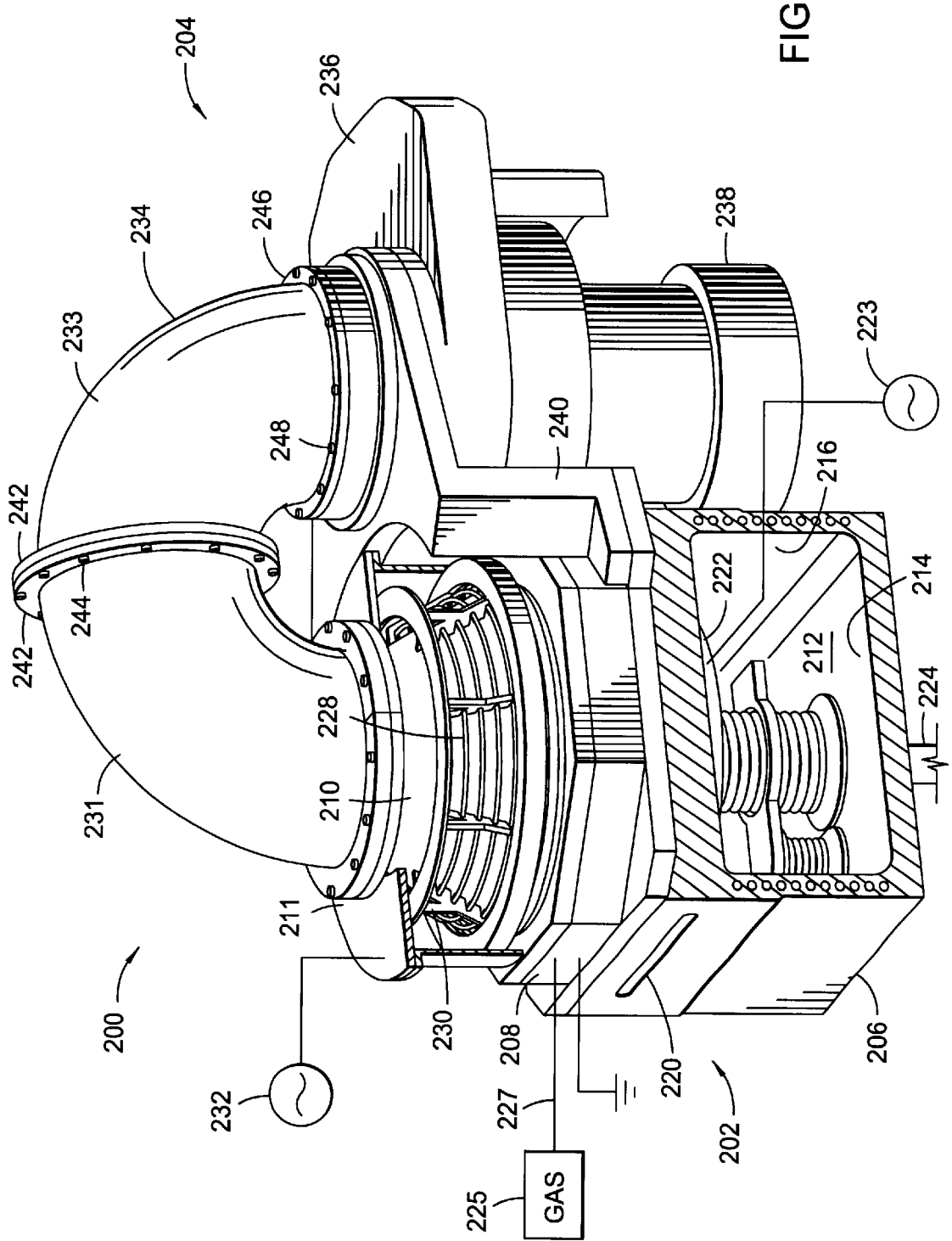
FIG. 2 is a perspective view of a processing system.

FIG. 2 shows a perspective view of a processing system 200. The processing system 200 generally includes a processing system 202 and a pumping assembly 204. The processing system 202 includes a chamber body 206, a gas manifold 208, a dome-shaped ceiling 210 and a housing 211. Although the ceiling 210 (also referred to as the "dome 210") is dome-shaped in one embodiment, the invention contemplates any geometric structure and shape. As one example, the ceiling 210 can be flat as will described below with reference to FIG. 5 below. A portion of the chamber body 206 is cut away to provide a view into an enclosure 212 defined by a floor 214 and a sidewall 216. The chamber body 206 may be made of one or more materials adapted to accommodate typical processing conditions. In one embodiment, the chamber body 206 is anodized aluminum.

A substrate support member 222 is disposed in the enclosure 212 and is adapted to support substrates during processing. The substrate support member 222 may include features well known in the art such as an electrostatic chuck, a vacuum chuck, a cathode assembly, and the like. A power supply assembly 223 can be coupled to the substrate support member 222 to provide power thereto as need according to the particular design. The power supply assembly 223 is preferably adapted to provide a bias to the upper surface of the substrate support member 222 for processes such as bias etching for example.

Preferably, the substrate support member 222 is vertically movable within the chamber body 206. Movement of the substrate support member 222 is accomplished by coupling an actuator (not shown), such as a stepper motor or pneumatic cylinder, to a shaft 224 of the substrate support member 222. In one embodiment, the movement of the substrate support member 222 facilitates both the loading and unloading of substrates and the sealing of the enclosure 212 from a processing region as will be described below.

Access for substrates into the chamber 202 is provided through a slit valve opening 220 formed in the sidewall 216. The slit valve opening may be selectively closed and opened by a valve (not shown). Alternatively, the slit valve opening 220 may be closed by the substrate support member itself 222 in the manner described below.

The gas manifold 208 is an annular member disposed at an upper end of the chamber body 206. In one embodiment, the gas manifold 208 provides a housing for gas delivery mechanisms such as nozzles or ports formed in the gas manifold 208. Thus, a fluid supply module 225 is connected to the gas manifold 208 by supply lines 227 to provide fluids to the gas manifold 208 during processing. The fluid supply module 225 contains one or more gases selected according to the particular processes performed in the chamber 202. In one embodiment, gas manifold 208 is a grounded member providing a return path for currents in the chamber 202 during plasma processing. Accordingly, the gas manifold 208 is preferably made of a conducting material such as anodized aluminum.

Although preferably separate components, in another embodiment, the gas manifold 208 and the chamber body 206 are a monolithic entity. In such an embodiment, the gas manifold 208 and the chamber body 206 may be formed of a single piece of material or may be separately formed pieces which are then permanently connected to one another by methods such as bonding, electron beam welding and the like.

In another embodiment, the gas delivery mechanisms are not disposed on or in the gas manifold 208. For example, the gas delivery mechanism, e.g., the nozzles or ports, may be disposed in the dome 210. In such an embodiment, the gas manifold 208 provides an upper chamber disposed between the chamber body 206 and the dome 210. The dome 210 is disposed on the gas manifold 208 and is surrounded by the housing 211. In the embodiment of FIG. 2, the dome 210 has a frustoconical shape having a larger diameter at a lower end registered with the gas manifold 208 and a smaller diameter at an upper end registered with the pumping assembly 204. The dome 210 provides a mounting surface for plasma generating devices such as the coil 228 which surrounds the dome 210 and is secured to an outer surface of the dome 210 by brackets 230. A power source 232 supplies a signal, such as a radio frequency signal, to the coil 228 during processing. In order to strike a plasma in the chamber 202, the dome 210 comprises a material that is transmissive to the electromagnetic energy supplied by the coil 228. In one embodiment, the dome 210 is a dielectric material such as ceramic. The dome 210 is surrounded by the housing 211 to prevent accidental touching of the coils 228 by an operator.

The pumping assembly 204 generally includes a top-mounted pumping manifold 234, an isolation valve assembly 236 and a pump 238. In one embodiment, the pumping manifold 234 is a single section or multi-sectional pipe or tube. In the embodiment shown in FIG. 2, the pumping manifold 234 comprises a first section 231 and a second section 233 joined together at mating flanges 242 to form a U-shaped tube. The first section 231 of the pumping manifold 234 is connected to the upper end of the dome 210. The second section 233 of the pumping manifold 234 is coupled to the isolation valve assembly 236 which, in turn, is disposed between the pumping manifold 234 and the pump 238 in order to control fluid communication therebetween. In one embodiment, the isolation valve assembly 236 is a gate valve and/or a throttle valve. The isolation valve assembly 236 and pump 238 are secured to a flange 240 which is cantilever-mounted to the chamber body 206. In other embodiments, the isolation valve assembly 236 and pump 238 may be secured independently of the chamber body 206. Additionally, other geometric arrangements between the valve 236 and pump 238 and the chamber body 206 are contemplated. For example, the valve 236 and pump 238 may be disposed substantially above the chamber body 206.

The pumping assembly 204 includes a test port manifold 313 disposed between the second section 233 of the pumping manifold 234 and the isolation valve assembly 236. In one embodiment, the test port manifold 313 is an integral part of the pumping manifold or the isolation valve assembly 236. The test port manifold 313 is a ring-shaped member having a port 315 formed in the manifold 313 which provides access into the interior of the pumping manifold 234. The port 315 is adapted to support any variety of testing and diagnostic equipment which require visual inspection of, or physical contact with, the exhaust stream flowing from the pumping manifold 234 to the pump 238. Illustratively, an in situ endpoint detector can be mounted in the port 315 to determine when an endpoint of a process (e.g., etch process) has been reached.

Figure 3:
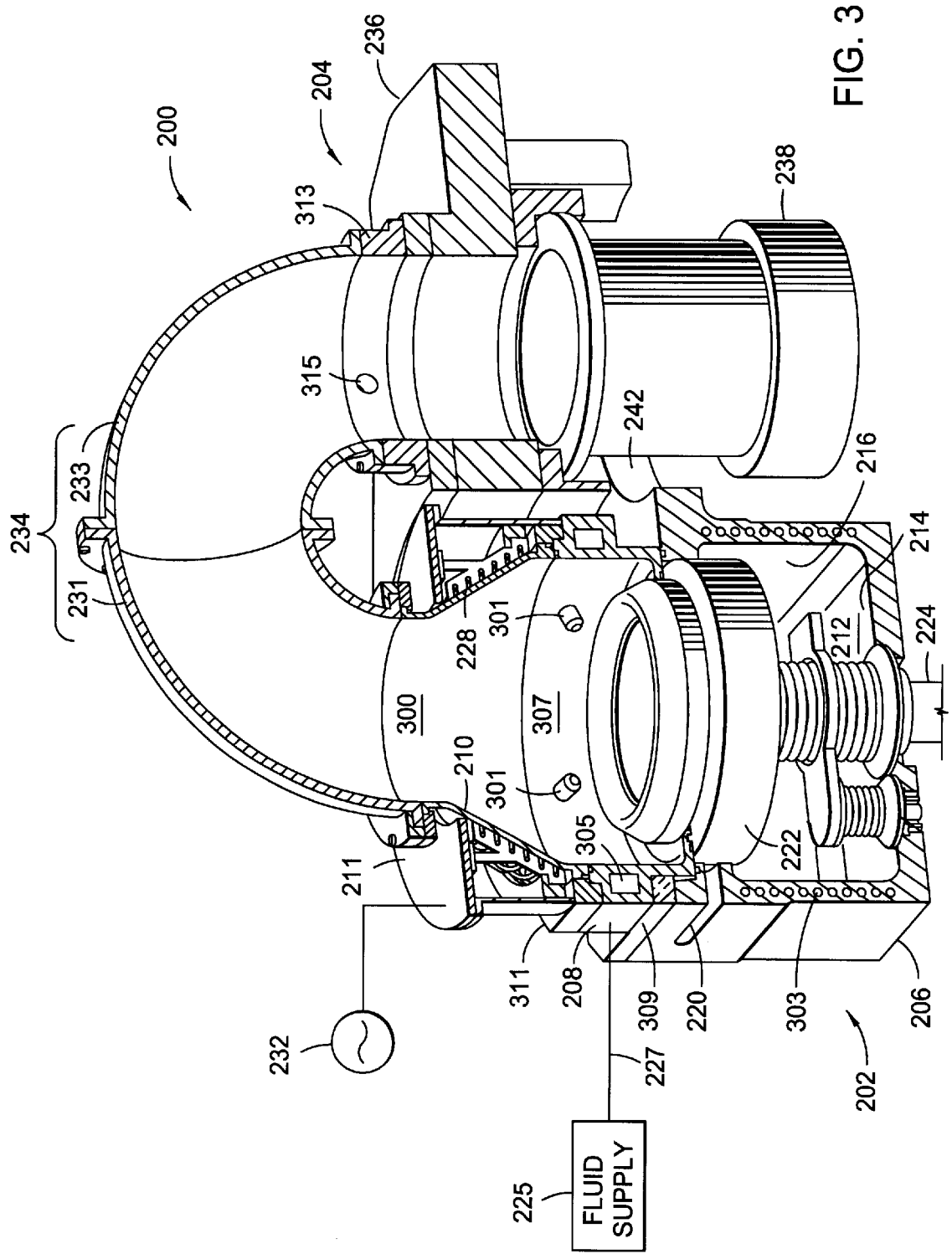
FIG. 3 is a perspective cut-away view of a processing system.

FIG. 3 is a sectional perspective view illustrating additional features of the processing system 200. The processing system 200 is preferably equipped with various temperature control devices. For example, cooling channels 303 are formed in the chamber body 206. During processing, a fluid, such as water, is flowed through the channels to cool the chamber body 206. While the chamber body 206 may be cooled, it is often desirable to heat the gas manifold 208 in order to prevent condensation of vaporized fluids flowing through the gas manifold 208. Accordingly, a heating member 311 is disposed on the gas manifold 208. In one embodiment, the heating member 311 includes a resistive heating element which is heated when energized by power from a power supply. To inhibit thermal conduction between the cooled chamber body 206 and the heated gas manifold 208, a thermal choke member 309 is disposed therebetween. The thermal choke member 309 is made of a material having low thermal conductivity, such as stainless steel.

The gas manifold 208 shown in FIG. 3 includes a plurality of nozzles 301. The nozzles 301 are annularly disposed on the gas manifold 208 and are directed inwardly therefrom. An annular channel 305 formed in the gas manifold 208 fluidly couples the nozzles 301 with the fluid supply module 225. In operation, fluid (typically a vaporized liquid precursor) is supplied from the fluid supply module 225 to the channel 305 which then allows the fluids to flow annularly through the gas manifold 208. The fluids are then expelled from channel 305 into a processing region 307 via the nozzles 301.

FIG. 3 shows the substrate support member 222 in a raised position for processing. In this position, the support member 222 defines a lower boundary to the processing region 307. An upper end of the dome 210 defines a pumping port 300 which fluidly couples the processing region 307 of the chamber 202 with the pumping assembly 204. Accordingly, the pumping port 300 provides an opening substantially above the support member 222 through which gases removed from the processing chamber 202. In one embodiment, the pumping port 300 has a diameter of between about 6 inches and about 12 inches.

The processing system 200 of FIG. 3 has particular application for inductive plasma processing utilizing coils 228. Striking and maintaining inductively coupled plasmas typically requires a single or multi-turn coil defining a sufficiently large diameter in order to couple power into the processing region 307. Thus, the opening defined by the coil 228 is exploited by the invention in that the pumping port 300 shares a common central axis with the opening of the coil 228. However, persons skilled in the art will recognize application to chambers without inductive coils, such as parallel plate reactors.

Figure 4:
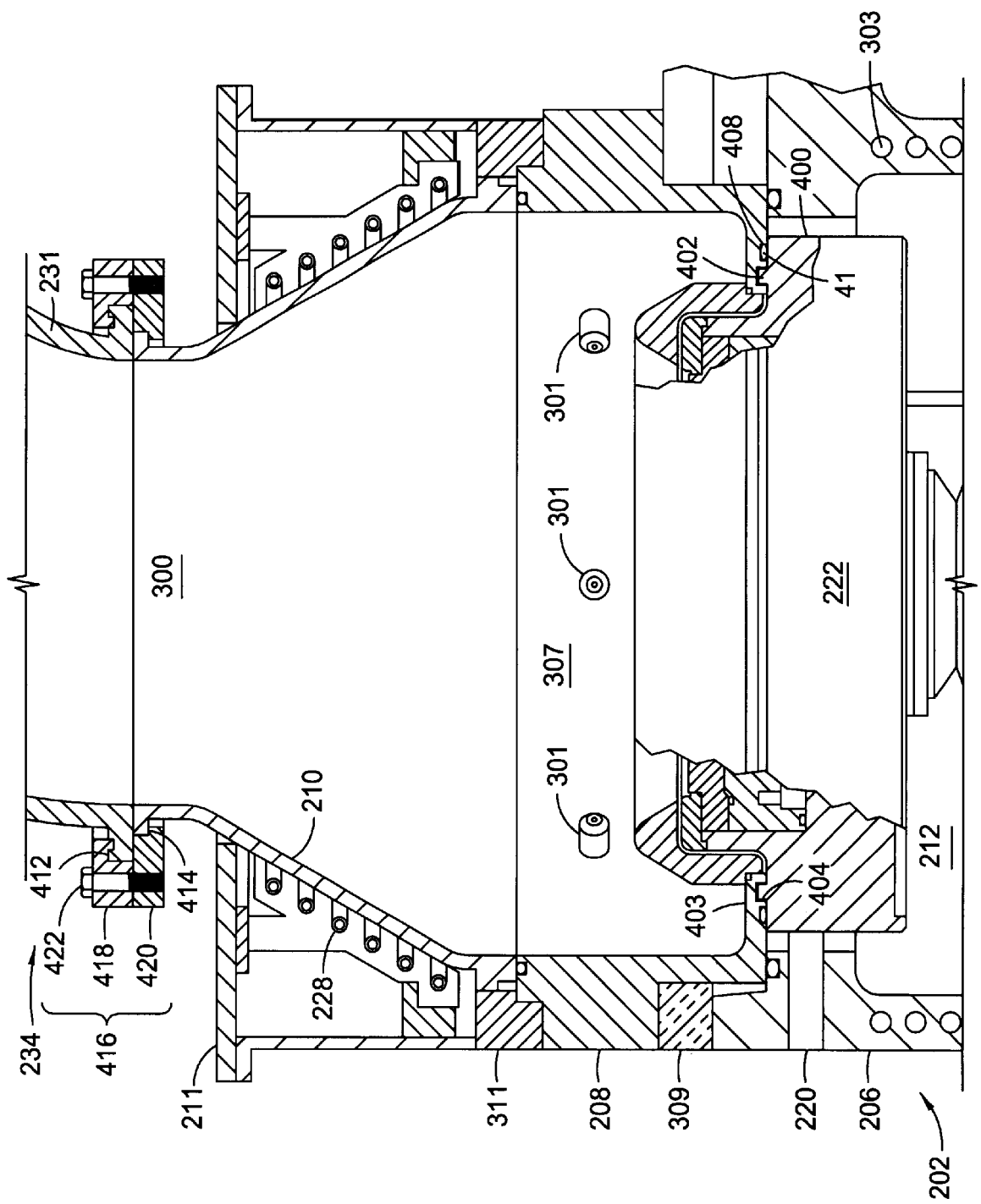
FIG. 4 is a cross-sectional view of a processing system.

FIG. 4 is a cross-sectional view showing the support member 222 and gas manifold 208. The substrate support member 222 includes a shoulder 400 having an annular raised portion 402 disposed thereon. In a raised position, the support member 222 is in mating abutment with a sealing flange 403 to seal the enclosure 212 from the processing region 307. In one embodiment, the sealing flange 403 is a lower portion of the gas manifold 208 which extends inwardly therefrom. The sealing flange 403 includes an annular recess 404 adapted to receive the raised portion 402. The sealing flange 403 further includes a dove-tail-groove 408 having an o-ring seal 410 disposed therein. When compressed against the shoulder 400, the o-ring seal 410 forms a fluid tight seal. Thus, the raised portion 402 provides a first seal to prevent plasma and gases from flowing from the processing region to the enclosure 212 while the o-ring seal 410 provides a second seal to further ensure isolation between the processing region 307 and the enclosure 212.

The processing system 200 is adapted to facilitate periodic service and maintenance. In one embodiment, the chamber body 206, gas manifold 208, the dome 210 and the pumping assembly 204 are separate components. To facilitate coupling and uncoupling the components from one another, the processing system 200 preferably employs fasteners accessible from the outside of the components. For example, as shown in FIG. 2, the first and second sections 231, 233 of the pumping assembly 234 are secured by screws 244 disposed through the mating flanges 242. Similarly, the pumping assembly 204 can be coupled to the pumping manifold 234 at a flange 246 disposed on the second section 233 with screws 248. Further, as shown in FIG. 4, a collar assembly 416 is used to couple the dome 210 with the pumping manifold 234. The collar assembly 416 includes an upper portion 418 and a lower portion 420 coupled to one another with screws 422. The upper portion 418 is fitted over a mating flange 412 of the pumping manifold 234 while the lower portion 420 is fitted over a mating flange 414 of the dome 210. The upper and lower portions 418, 420 are secured to one another by the screws 422, thereby coupling the dome 210 to the pumping manifold 234.

Figure 5:
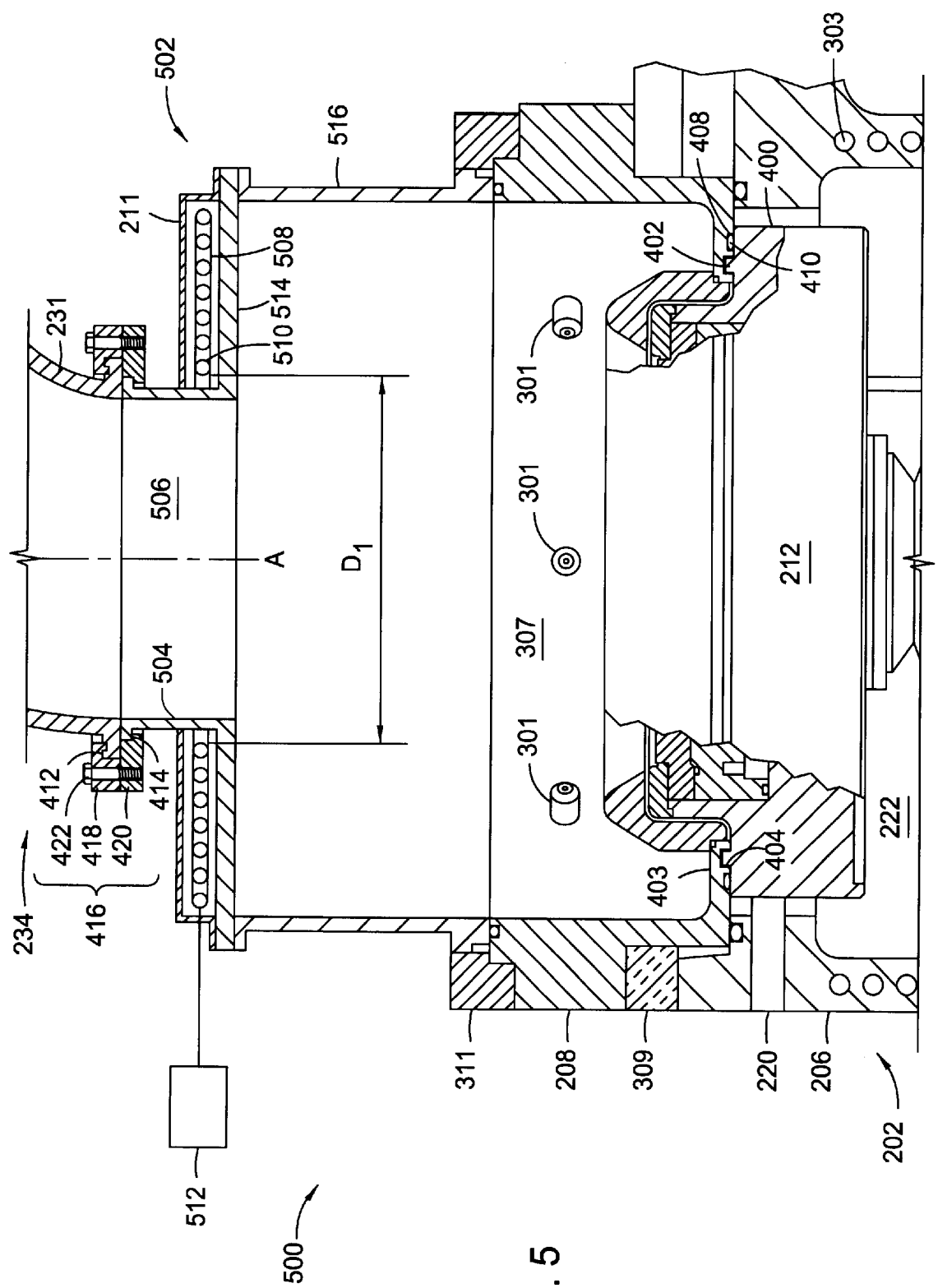
FIG. 5 is a cross-sectional view of an alternative processing system.

The embodiments of FIGS. 1–4 are merely illustrative and the invention contemplates any construction and shape of the system 200. In particular, the ceiling of the system 200 need not be dome-shaped as is dome 210. FIG. 5 is a cross sectional view of one embodiment of a system 500 of the present invention having a generally flat lid assembly 502.

The lid assembly 502 includes a top, or lid 514, disposed on an annular wall 516. The lid 514 and the annular wall 516 may be of the same or of different materials. In one embodiment, the lid 514 and the annular wall 516 comprise a dielectric, such as ceramic, which is transmissive to electromagnetic energy. A pumping manifold 234 is coupled to the lid assembly 502 and defines a pumping port 506 for evacuating the processing region 307. Inductive coils 508 are conformally disposed on the lid assembly 502. The turns of the inductive coils 508 are coplanar and spiral about a common axis A. The inner most coil turn 510 defines an opening D1 having a diameter greater than a pumping port 506 so that the turns of the inductive coil 508 are concentrically disposed relative to the pumping port 506. In operation, power is supplied to the inductive coils 508 from a power assembly 512 which may include a power source, a matching network and other components known and unknown in the art for generating and maintaining a plasma in the system 500.

Figure 6:
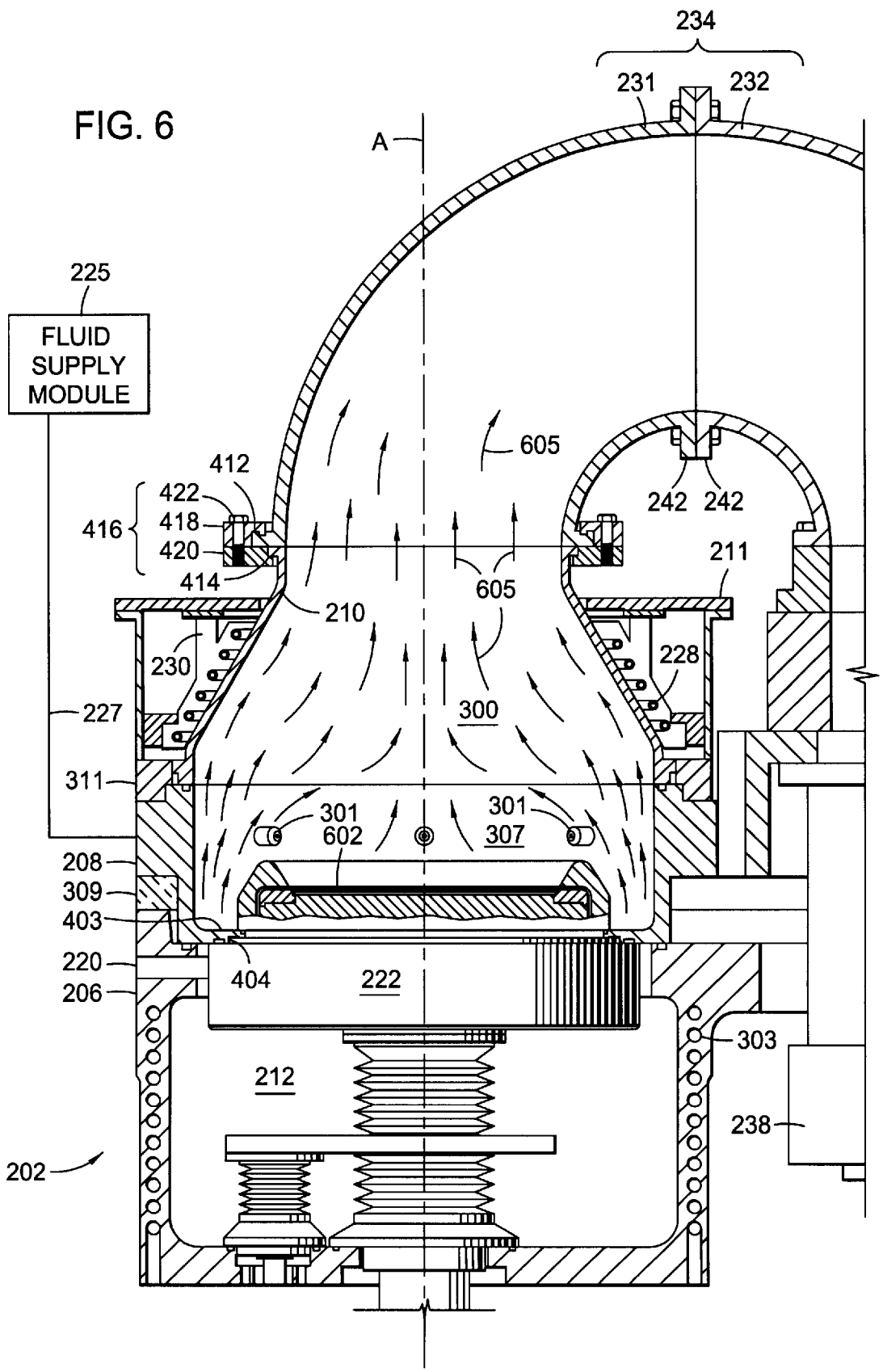
FIG. 6 is a cross-sectional view of a processing system showing the flow pattern of gases during processing.

Referring now to FIG. 6, the operation of the processing system 200 will be described. Illustratively, an etch process is described but it is understood that any plasma process may be performed using the processing system including, but not limited to, deposition processes. A substrate 602 is delivered to the processing system 202 and positioned on the support member 222. The support member 222 is raised to contact the sealing flange 403. Processing system 202 is then pumped down to a desired pressure and plasma is struck. Evacuation of the chamber 202 to the desired pressure is accomplished by opening the isolation valve assembly 236 to allow communication between the processing region and the pump 238. The isolation valve assembly 236 is preferably adjustable so that the chamber pressure may be controlled by operation of the isolation valve. Thus, for example, the isolation valve assembly 236 may include a throttle valve used to variably restrict the flow of gases from the pumping manifold to the pump.

Process gases are then flowed into the processing system 202 from the fluid supply module 225 via the nozzles 301. Upon reaching the plasma striking pressure, the power source 232 provides a signal to the coil 228. Accordingly, the coil 228 is energized and energy is coupled into the processing region 307. The energy is sufficient to ionize at least a portion of the gases, thereby forming a plasma containing reactive species. The reactive species then contact the substrate 602 to etch a portion of material from the substrate 602.

In general it is desirable to confine the plasma in a region proximate to the substrate 602, i.e., in the processing region 307. In one embodiment, additional methods and apparatus may be employed to further control the properties of the plasma including distribution and density. For example, permanent magnets or electromagnets may be positioned at an upper end the dome 210. The magnets are believed to provide a magnetic field which acts to inhibit the flow of the charged plasma constituents from the processing region 307 into the pumping manifold 234.

During processing, the pressure conditions in the processing system 02 are controlled by operation of the pumping assembly 204. As a result, gases flow through the pumping port 300, along the pumping manifold 234 and then to the pump 238. The provision of the pumping port 300 at an upper end of the processing system 202 provides a symmetric flow of gases. The flow pattern of gases and chamber 202 is illustrated by arrows 605 in FIG. 6. The density of arrows indicates a flow differential along a plane of the figure. Notably, the flow pattern in the region adjacent the substrate is substantially uniform. As a result, the substrate is uniformly processed, e.g., etched.

Disregarding gas load due to material vapor, leakage, outgassing and permeation, the pressure in the processing system 202 is primarily controlled by the pump 238. In one embodiment, the processing pressure is sufficiently low to allow molecular flow of gases from the processing region 307 to the pumping assembly 204 via the port 300. Molecular flow refers to gas flow of molecules where the mean free path between molecules is much greater than the dimensions of the chamber components containing the gas. In one embodiment, the processing pressure may be less than about 1 mTorr where the volume defined by the dome 210 and the gas manifold 208 is between about 200 cubic inches and about 100,000 cubic inches. The pump 238 may be selected from one of a turbomolecular pump, a cryo-pump, a mechanical pump, such as a roughing pump, and any combination thereof. In one embodiment, the pumping speed of the pump 238 is between about 300 L/sec and about 6000 L/sec.

The gas flow symmetry is further achieved by the symmetry of the chamber itself.

For example, the gas manifold 208 and the dome 210 are substantially symmetrically disposed relative to one another and to the support member 222. The chamber symmetry is illustrated in FIG. 6 relative to a central axis A. In combination with the centrally located port 300, the symmetrical chamber design provides a symmetrical flow path for the gases from the processing region 307. The flow path is unobstructed by chamber components such as a support member or other devices disposed in the flow path of prior art processing systems.

The chamber symmetry also provides a symmetrical grounded surface. Plasma processing systems require a grounded component in order to provide a return path for currents. Processing results can be improved by grounding the gas manifold 208. Because of its symmetry, the gas manifold 208 provides a uniform return path for currents in the plasma. As a result, a uniform plasma can be maintained in the processing region 307, thereby leading to improved processing results such as uniform removal of material from a substrate during an etching process.

The chamber design symmetry also facilitates serviceability. For example, process chamber surfaces are often coated with a material adapted to inhibit corrosion of chamber components. As described above, conventional methods of application, including spraying the material onto the surfaces with an automated device, do not provide uniform deposition of the material. The processing system 200, however, is easily accessible to coating devices. For example, the annular symmetry of the gas manifold allows a spray to be uniformly deposited on all interior surfaces of the manifold from a coating device moving linearly and rotationally along the central axis A (shown in FIG. 6). Accordingly, the useful life of the chamber components is increased.

The processing system 200 is also believed to reduce contamination problems resulting from build-up on the dome 210. Prior art chambers, such as the one shown in FIG. 1, suffer from flaking, primarily at an upper central portion of the dome. Because the substrate being processed is located directly below this central portion, the potential for contamination is increased. In contrast, the dome 210 includes the pumping port 300 in a central portion of the dome 210, thereby mitigating the problems of prior art.

Additionally, the surface area on which deposition may form, and later flake from, is effectively increased by the provision of the pumping manifold 234.

Alternative embodiments may include temperature control units to control the temperature of the dome 210. However, it is believed that such a unit is unnecessary. Such a unit is needed by conventional systems to prevent thermal gradients on the ceiling which can cause deposition on the inner surface of the ceiling to flake and deposit on a substrate. While one embodiment of the processing system 200 may include a temperature control unit, it is believed that a dome cooling unit is unnecessary as a result of the pumping port 300 formed at the upper end of the dome 210 and the top-mounted pumping manifold 234. As noted above, the provision of the port 300 in the dome 210 increases the available surface area above the support member 222 on which material may deposit to include the pumping manifold 234. Additionally, the pumping manifold 234 itself acts as a heat sink for thermal energy from the dome 210. Thus, some heat is allowed to dissipate from the dome 210 to the pumping manifold 234, thereby cooling the dome 210. Accordingly, the mean-wafer-between-clean (MWBC) can be significantly reduced.

In the event that cleaning of the processing system 200 is needed, the fluid supply unit 225 may provide cleaning agents as are known in the art. In one cleaning process, a plasma is maintained in the processing region 307 to facilitate removal of material from the inner surfaces of the gas manifold 208, the dome 210 and the support member 222. Alternatively or additionally, a plasma may be provided in the pumping manifold 234 to facilitate removal of material deposited on the inner surfaces thereof. In one embodiment, the desired plasma is maintained by biasing in the pumping manifold 234 with power from one of the power supply assembly 223, the power source 232 or another power supply.

While the foregoing is directed to the preferred embodiment of the present invention, other and further embodiments of the invention may be devised without departing from the basic scope thereof, and the scope thereof is determined by the claims that follow.

What is claimed is:

1. A plasma processing apparatus, comprising:
    a chamber body comprising a floor and a sidewall defining an enclosure;
    a substrate support member disposed in the enclosure and defining a substrate support surface;
    an annular gas manifold disposed at an upper end of the chamber body and forming a central gas manifold opening; wherein the annular gas manifold comprises a plurality of processing fluid outlets disposed symmetrically and annularly around a processing region;
    an annular energy transmissive member disposed on the gas manifold and forming a central opening registered with the central gas manifold opening;
    a plasma generating assembly disposed around the energy transmissive member; and
    a pumping assembly coupled to the energy transmissive member, wherein the pumping assembly defines a central exhaust port;
    wherein the processing region is defined between the substrate support surface and the central exhaust port; wherein the central exhaust port, the substrate support surface, the central opening of the energy transmissive member and the central gas manifold opening are disposed on a common central axis, so that the central exhaust port is disposed over and facing the substrate support surface; and wherein a central unobstructed exhaust pathway is defined between the substrate support surface and the central exhaust port.

2. The apparatus of claim 1, wherein the plurality of processing fluid outlets is a plurality of processing fluid nozzles.

3. The apparatus of claim 2, wherein the nozzles are radially disposed toward the processing region.

4. A plasma processing apparatus, comprising:
    a chamber body comprising a floor and a sidewall defining an enclosure;
    a substrate support member disposed in the enclosure and defining a substrate support surface;
    an annular gas manifold disposed at an upper end of the chamber body and forming a central gas manifold opening; wherein the annular gas manifold comprises a plurality of processing fluid outlets disposed symmetrically and annularly around a processing region;
    an annular energy transmissive member disposed on the gas manifold and forming a central opening registered with the central gas manifold opening;
    a plasma generating assembly disposed around the energy transmissive member; and
    a pumping assembly coupled to the annular energy transmissive member, wherein the pumping assembly defines a central exhaust port;
    wherein the processing region is defined between the substrate support surface and the central exhaust port; wherein the substrate support surface and the central exhaust port are in facing relationship with one another and are disposed on a common central axis, and wherein a central unobstructed exhaust pathway is defined between the substrate support surface and the central exhaust port.

5. The apparatus of claim 4, wherein the plurality of processing fluid outlets is a plurality of processing fluid nozzles.

6. The apparatus of claim 5, wherein the nozzles are radially disposed toward the processing region.

7. A plasma processing apparatus, comprising:
    a chamber body comprising a floor and a sidewall defining an enclosure;
    a substrate support member disposed in the enclosure and defining a substrate support surface;
    an annular gas manifold disposed at an upper end of the chamber body and forming a central gas manifold opening, wherein the annular gas manifold comprises a plurality of processing fluid gas outlets disposed symmetrically and annularly around a processing region;
    an annular energy transmissive member disposed on the gas manifold and forming a central opening registered with the central gas manifold opening;
    a coil assembly disposed around the annular energy transmissive member, wherein the coil assembly is adapted to inductively couple RF power into the processing region; and
    a pumping assembly including an exhaust port and coupled to the upper end of the energy transmissive member;
    wherein the processing region is defined between the substrate support surface and the exhaust port; wherein the substrate support surface and the exhaust port are in facing relationship with one another and are disposed on a common central axis, and wherein a central unobstructed exhaust pathway is defined between the substrate support surface and the central exhaust port.

8. The apparatus of claim 7, wherein the central opening of the energy transmissive member and the central gas manifold opening are disposed on the common central axis.

9. The apparatus of claim 7, wherein the plurality of processing fluid outlets is a plurality of processing fluid nozzles.

10. The apparatus of claim 9, wherein the nozzles are radially disposed toward the processing region.

* * * * *

UNITED STATES PATENT AND TRADEMARK OFFICE
CERTIFICATE OF CORRECTION

PATENT NO. : 6,592,709 B1
DATED : July 15, 2003
INVENTOR(S) : Lubomirsky

It is certified that error appears in the above-identified patent and that said Letters Patent is hereby corrected as shown below:

Column 4,
Line 48, please begin a new paragraph at "The Dome 210 is".

Column 7,
Line 60, please change "02" to -- 202 --.

Column 8,
Line 7, please delete "10".

Signed and Sealed this

Sixteenth Day of December, 2003

JAMES E. ROGAN
*Director of the United States Patent and Trademark Office*